(12) United States Patent
Su

(10) Patent No.: US 6,956,741 B2
(45) Date of Patent: Oct. 18, 2005

(54) SEMICONDUCTOR PACKAGE WITH HEAT SINK

(75) Inventor: Huan-Ping Su, Hsinchu (TW)

(73) Assignee: Ultratera Corporation, Hsinchu (TW)

( * ) Notice: Subject to any disclaimer, the term of this patent is extended or adjusted under 35 U.S.C. 154(b) by 220 days.

(21) Appl. No.: 10/659,528

(22) Filed: Sep. 9, 2003

(65) Prior Publication Data

US 2004/0184240 A1    Sep. 23, 2004

(30) Foreign Application Priority Data

Mar. 18, 2003  (TW) .............................. 92105857 A

(51) Int. Cl.[7] .............................................. H05K 7/20
(52) U.S. Cl. .................... 361/704; 165/80.2; 165/80.3; 165/185; 257/707; 257/713; 257/777; 361/707; 361/708; 361/710; 361/718; 361/719
(58) Field of Search .............................. 165/80.2, 80.3, 165/185; 257/706–707, 711–713, 777–778; 361/704–710, 361/714–721

(56) References Cited

U.S. PATENT DOCUMENTS

| | | | | |
|---|---|---|---|---|
| 4,396,936 A | * | 8/1983 | McIver et al. .............. | 174/252 |
| 5,285,352 A | * | 2/1994 | Pastore et al. .............. | 361/707 |
| 5,642,261 A | | 6/1997 | Bond et al. | |
| 5,661,902 A | * | 9/1997 | Katchmar ..................... | 29/840 |
| 5,729,432 A | * | 3/1998 | Shim et al. .................. | 361/690 |
| 5,903,052 A | * | 5/1999 | Chen et al. .................. | 257/706 |
| 6,130,477 A | * | 10/2000 | Chen et al. .................. | 257/712 |

* cited by examiner

Primary Examiner—Gregory Thompson
(74) Attorney, Agent, or Firm—Mikio Ishimaru

(57) ABSTRACT

A semiconductor package with a heat sink is provided, having a substrate formed with at least one opening penetrating therethrough. A heat sink is mounted on a surface of the substrate same as for forming solder balls and seals one end of the opening by a thermally conductive adhesive. At least one chip is mounted on the other surface of the substrate opposite to the heat sink via the thermally conductive adhesive and covers the other end of the opening. The thermally conductive adhesive is filled in the opening between the substrate and the heat sink and allows heat produced by the chip to be dissipated through a shorter thermally conductive path. By the above arrangement with the heat sink being mounted between the chip and an external device, the heat sink provides electromagnetic shielding between the chip and the external device and enhances electrical performance of the semiconductor package.

16 Claims, 2 Drawing Sheets

SEMICONDUCTOR PACKAGE WITH HEAT SINK

FIELD OF THE INVENTION

The present invention relates to semiconductor packages, and more particularly, to a semiconductor package with a heat sink so as to enhance the heat dissipation rate of the semiconductor package.

BACKGROUND OF THE INVENTION

The reason why a Ball Grid Array (BGA) package has become a mainstream of the package products these days is mainly because of its sufficient provision of I/O connections to meet the demands of semiconductor chips on which a high density of devices and circuitry is integrated. However, the more devices and circuitry that are integrated on a semiconductor chip, the more heat that is generated. Without dissipating the heat generated by the semiconductor chip in a timely manner, the life and performance of the semiconductor chip will be greatly reduced.

In order to solve the above-mentioned drawbacks, the idea of adding a heat sink into a semiconductor package has thus arisen. The technique is to wrap the semiconductor chip together with the heat sink inside molding compound, after the semiconductor chip has been adhesively positioned on the heat sink. Although the method for wrapping the heat sink into the molding compound helps to enhance the heat dissipation rate, it increases the overall height of the semiconductor package. At the same time, the dissipation path for the heat generated on the surface of the semiconductor chip requires the heat to move from the semiconductor chip to the heat sink and then through the molding compound, where it finally dissipates into the ambient environment. This thermally conductive path is too long and, moreover, the heat needs to pass through molding compound having a low heat dissipation rate, It is thus very hard to enhance the overall heat dissipation rate of this idea.

To address these drawbacks, U.S. Pat. No. 5,642,261 discloses a semiconductor package, in which the substrate has a cavity to accommodate a heat sink. As shown in FIG. 4, the heat generated on the semiconductor chip is directly transferred to the printed circuit board (PCB) connected with the semiconductor package through the heat sink having a large heat dissipation area. Although such a structure may enhance the performance of heat dissipation rate without increasing the overall height of the semiconductor package, such a semiconductor package requires forming an opening through the substrate so as to insert a heat sink therein. By connecting the chip with the heat sink, the heat generated by the chip is then directly dissipated to the atmosphere. Nevertheless, since an opening with a fixed size is required to be formed on the substrate to insert a heat sink, the size of the opening must coincide with the size of the heat sink to prevent the humidified air outside from entering inside of the package through the gap formed between the substrate and the heat sink. This increases the requirements of manufacturing precision and difficulties during operation. Moreover, since the coefficient of thermal expansion of the substrate and the coefficient of thermal expansion of the heat sink are often significantly different from each other, the effect of thermal stress during a thermal cycle and a reliability test may induce cracking at the connecting surface of the substrate and the heat sink. Humidified air may thus enter inside the package through the gap formed between the substrate and the heat sink and affect the reliability of the semiconductor package.

SUMMARY OF THE INVENTION

In view of the drawbacks of the prior art described above, the primary objective of the present invention is to provide a semiconductor package with a heat sink to effectively dissipate the heat generated in a semiconductor chip without increasing the overall height of the package.

Another objective of the present invention is to provide a semiconductor package with a heat sink, wherein the heat sink needs not to be inserted into a substrate while still being able to provide enough heat dissipation area to rapidly dissipate the heat generated in a chip, thus avoiding the existence of a significant difference between the coefficient of thermal expansion of the substrate and the coefficient of thermal expansion of the heat sink resulting in thermal stress, which induces cracking at the connecting surface of the substrate and the heat sink during thermal cycling and reliability testing allowing entry of humidified air inside of the package through the gap formed between the substrate and the heat sink, thereby adversely influencing the reliability of the semiconductor package.

Yet another objective of the present invention is to provide a semiconductor package with a heat sink such that a chip is shielded from the external printed circuit board by a heat sink in such a way as to enhance the electromagnetic shielding effect. Electromagnetic interference is thus reduced and the electrical performance of the package is significantly increased.

In order to accomplish the above-mentioned and other objectives, a semiconductor package with a heat sink proposed by the present invention includes a substrate, at least one heat sink, at least one semiconductor chip, a plurality of first electrically conductive elements, a molding compound, and a plurality of second electrically conductive elements. On the substrate, at least one opening is formed penetrating through the upper and lower surface thereof. The one or more heat sinks have a first surface and a corresponding second surface, wherein on the first surface a thermally conductive adhesive is applied such that the heat sink is adhered on the substrate for closing one side of the opening penetrating the substrate. The bottommost semiconductor chip is adhesively positioned at the opening penetrating the substrate corresponding to the heat sink by a thermally conductive adhesive, which fully fills in the space between the chip and the heat sink. A plurality of first conductive elements is provided to form electric coupling between the semiconductor chip and the substrate. Molding compound is used to wrap the semiconductor chip, a plurality of first conductive elements and a portion of the substrate. A plurality of second conductive elements is connected on the substrate on the same side of the heat sink permitting the substrate to electrically connect with external devices.

The semiconductor package of the present invention involves positioning a semiconductor chip and a heat sink, respectively, on two sides of the opening formed in the substrate, and fully filling a thermally conductive adhesive therebetween. The difficulties of the semiconductor packaging process in the prior art that inserts a heat sink into a substrate and the cracking at the connecting surface of the substrate and the heat sink are prevented, avoiding cracking induced by the effect of thermal stress generated during thermal cycling and reliability testing, due to the difference between the coefficients of thermal expansion of the substrate and the heat sink, which allows the humidified air to enter the package through the cracks between the substrate and the heat sink, affecting the reliability of the semiconductor package. Moreover, through the thermally conductive adhesive applied between the semiconductor chip and the heat sink, the heat generated in the semiconductor chip may be directly transferred to the heat sink through a heat dissipation path kept to a minimum length. Further, when the finished semiconductor package is soldered to the printed circuit board, the heat sink is hidden in the gap between the bottom of the chip and the printed circuit board created by the second electrically conductive elements. Thus, the addition of a heat sink will not increase the overall height of the finished package. Moreover, electromagnetic shielding is provided by the heat sink between the semiconductor chip and the printed circuit board, thereby enhancing electromagnetic shielding of the semiconductor and reducing electromagnetic interference. As a result an end product having better electrical properties is fabricated.

DETAILED DESCRIPTION OF THE PREFERRED EMBODIMENTS

Figure 1:
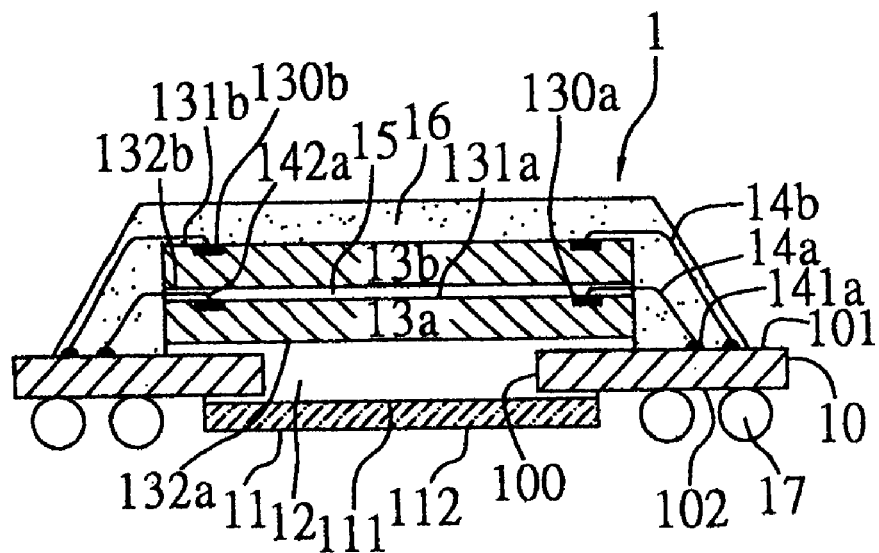
FIG. 1 is a cross-sectional diagram of a semiconductor package, in accordance with the first embodiment of the present invention.

FIG. 1 is a cross-sectional diagram of a semiconductor package, in accordance with one embodiment of the present invention.

As shown, the semiconductor package 1 is a Window Ball Grid Array (Window-BGA) package having many chips, which comprises: a substrate 10, on which at least one opening 100 is formed; a heat sink 11, for closing one side of the opening 100 formed on the substrate; a thermally conductive adhesive 12, which is applied on the heat sink 11 for adhesively connecting heat from the heat sink 11 on the surface of the substrate 10; a first chip 13a, which is adhesively connected to the other side of the heat sink corresponding to the opening 100 formed on the substrate, with the thermally conductive adhesive 12 fully filling the space between the first chip 13a and the heat sink 11; a plurality of first bonding wires 14a, which enables the first chip 13a to electrically connect with the substrate 10; a second chip 13b, which is adhesively connected to the first chip 13a by an adhesive layer 15 formed on the first chip 13a; a plurality of second bonding wires 14b, which enables the second chip 13b to electrically connect with the substrate 10; a molding compound 16, which encapsulates the first chip 13a, the first bonding wires 14a, the second chip 13b and the second bonding wires 14b; and a plurality of solder balls, which are positioned on the same side of the substrate 10 as the heat sink 11 to electrically connect the substrate 10 with external devices on a printed circuit board. In this embodiment, a semiconductor package for a multi-chip module is described in detail, of course, the present invention may also apply to a semiconductor package of single chip.

The material of the substrate 10 may be selected from one of the organic materials of, for example, FR-4 resin, FR-5 resin, and BT (Bismaleimide Triazine) resin. The substrate has an upper surface 101 and a lower surface 102 relative to the upper surface 101, where at least one opening 100, penetrating through the upper surface 101 and the lower surface 102, of the substrate 10 is formed.

The heat sink 11 having a first surface 111 and a second surface 112 relative to the first surface 111 is a thin plate structure fabricated from material such as copper, copper alloy, silver, silver alloy, or other metallic materials of good thermal conductivity. In order to increase the adhesion between the first surface 111 of the heat sink and the thermally conductive adhesive 12, the steps of black oxidation, brown oxidation or horizontal brown oxidation are implemented on the first surface 111 of the heat sink, making the first surface 111 of the heat sink 11 passivated. Meanwhile, in order to prevent the heat sink 11 from hindering the subsequent operation of solder ball 17 implantation, the thickness of the heat sink 11 should be smaller than the vertical height of the solder ball 17 after soldering back.

The thermally conductive adhesive 12 is a uniform mixture of at least one type of organic vehicle, solvent, and metallic powder selected from the group consisting of copper, copper alloy, silver, and silver alloy powder. The first surface 111 of the heat sink 11 is adhered to the lower surface 102 of the substrate by the thermally conductive adhesive 12 to close one side of the penetrating opening 100. Also, because the thermally conductive adhesive 12 filling in the space between the first surface 111 of the heat sink 11 and the first chip 13a contains highly thermally conductive metallic particles, such as copper and silver, the heat generated by operation of the chip may be rapidly transferred to the heat sink 11 through the thermally conductive adhesive 12.

The first chip 13a has an active surface 131a, on which a plurality of bonding pads 130a are predefined (i.e. the surface is arranged with many circuit devices and circuitry), and a corresponding non-active surface 132a. The non-active surface 132a of the first chip 13a is adhered to the upper surface 101 of the substrate 10 by the thermally conductive adhesive 12. The thermally conductive adhesive 12 fully fills the space between the first chip 13a and the heat sink 11 such that the heat generated by operation of the chip may be rapidly transferred to the heat sink 11 through the thermally conductive adhesive 12.

The first bonding wires 14a electrically connect the first chip 13a with the substrate 10 by means of reverse wire bonding, i.e. heating the outer end 141a of the first bonding wires 14a and forming a ball on the bonding pad (not shown) of the upper surface 10 of the substrate, and stitch bonding the chip end 142a of the first bonding wire 14a to a ball bond (not shown) predefined on the bonding pad 130a while stretching the first bonding wires 14a out to the bonding pads 130a of the first chip 13a, thus completing the bonding operation for the first bonding wires 14a. Since the first bonding wires 14a electrically connect the first chip 13a and the substrate 10 by means of the reverse wire bonding, the first bonding wires 14a, located at the upper portion of the first chip 13a, are only slightly higher than the top surface of the first chip 13a. The height of the wire arch is thus lowered, reducing the overall package height.

The adhesive layer 15 is composed of electrically non-conductive epoxy. After completing the soldering operation for the first bonding wires 14a, the adhesive layer 15 is applied on the active surface of the first chip 13a so as to adhere the non-active surface 132b of the second 13b onto the first chip 13a. Since the applied adhesive layer 15 fully fills the space between the first chip 13a and the second chip 13b, the first bonding wires 14a are covered such that contact between the first bonding wires 14a and the second chip is avoided and damage is prevented. Meanwhile, there is no size limitation for other chips positioned above the first chip 13a.

The second bonding wires 14b electrically connect the bonding pads 130b on the active surface 131b of the second chip and the bonding pads 130b of the upper surface 101 of the substrate, after the second chip 13b is adhesively connected to the adhesive layer 15. The first chip 13a, the first bonding wires 14a, the second chip 13b and the second bonding wires 14b are embedded into the molding compound 16 to maintain airtightness from outside air. Finally, a plurality of solder balls 17 is implanted into the lower surface 102 of the substrate 10 on the same side as the heat sink 11 to electrically connect the substrate 10 with external devices such as a printed circuit board.

Figure 2:
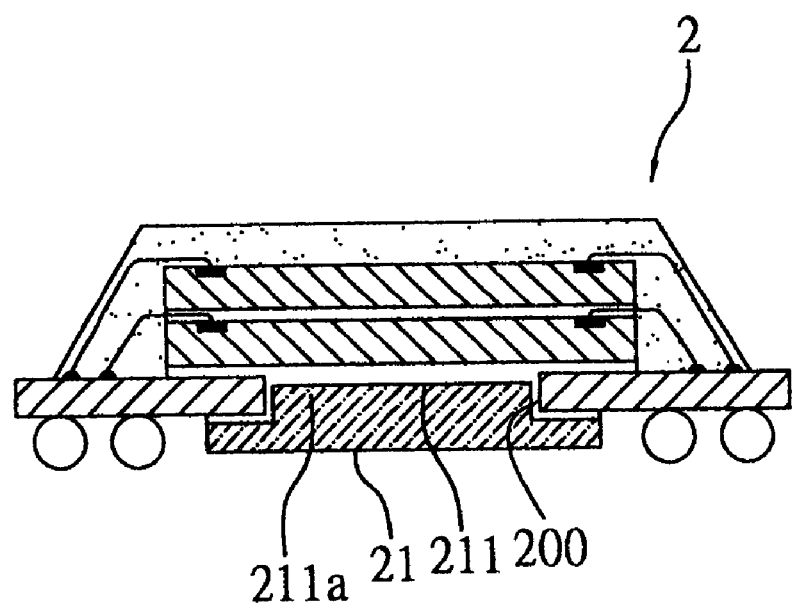
FIG. 2 is a cross-sectional diagram of a semiconductor package, in accordance with the second embodiment of the present invention.

As shown in FIG. 2, a cross-sectional diagram of a semiconductor package with a heat sink is illustrated in accordance with the second embodiment of the present invention. The structure of the semiconductor package 2 of the second embodiment is similar to that of the first embodiment described above, wherein the difference is that a protruding portion 211a is formed on the first surface 211 of the heat sink 21 to insert into the penetrating opening 200 of the substrate. The distance between the chip and the heat sink 21 is thus shortened so as to enhance the heat dissipation performance of the package by shortening the heat dissipation path.

Figure 3:
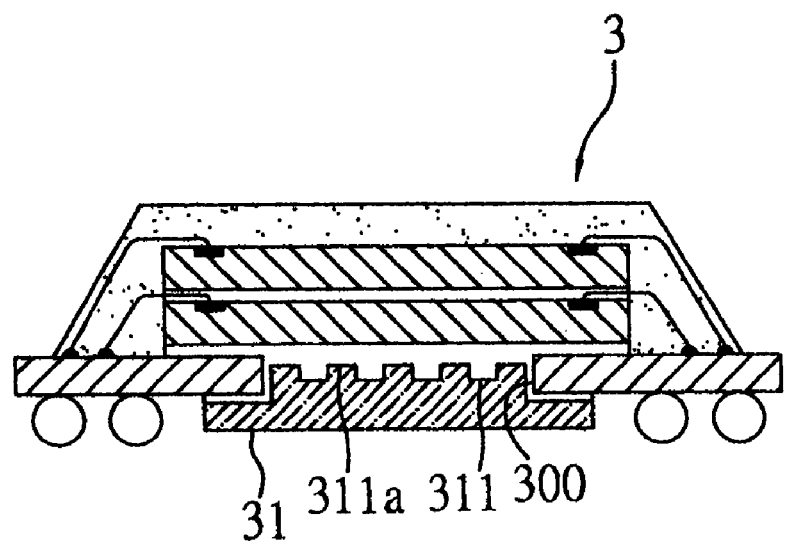
FIG. 3 is a cross-sectional diagram of a semiconductor package, in accordance with the third embodiment of the present invention.
Figure 4:
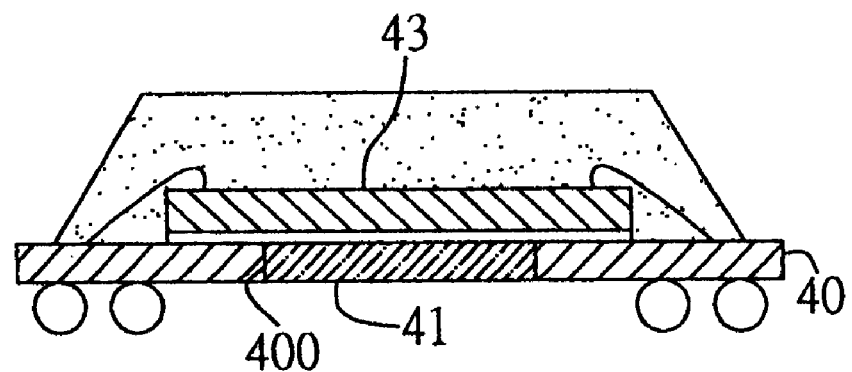
FIG. 4 (PRIOR ART) is a cross-sectional diagram of a semiconductor package, in accordance with U.S. Pat. No. 5,642,261.

As shown in FIG. 3, a cross-sectional diagram of a semiconductor package with a heat sink is illustrated in accordance with the third embodiment of the present invention. The structure of the semiconductor package 3 of the third embodiment is similar to that of the second embodiment described above, wherein the difference is that a plurality of spaced protruding portions 311a is formed on the first surface 311 of the heat sink 31 to insert into the penetrating opening 300 of the substrate. The distance between the chip and the heat sink 21 is thus shortened so as to enhance the heat dissipation performance of the package by shortening the heat dissipation path. The increased surface area due to plurality of spaced protrusions 311a also results in enhanced heat dissipation.

It is appreciated that the embodiments described above are provided only for explaining the particular features and functions of the present invention, but not for limiting the applicable implementation of the present invention. Any equivalent alternation and modification benefited from the present invention disclosed above is considered within the spirit and scope as defined in the following claims.

What is claimed is:

1. A semiconductor package, comprising:
   a substrate having at least one opening penetrating therethrough;
   a heat sink having a first surface and a corresponding second surface, wherein a thermally conductive adhesive is applied on the first surface of the heat sink, via which the heat sink is attached to the substrate and covers one end of the opening of the substrate;
   at least one semiconductor chip mounted on the substrate and over the other end of the opening via the thermally conductive adhesive, making the thermally conductive adhesive filling the opening interposed between the semiconductor chip and the heat sink;
   a plurality of first conductive elements for electrically coupling the semiconductor chip to the substrate;
   a molding compound for encapsulating the semiconductor chip, the plurality of first conductive elements, and a portion of the substrate; and
   a plurality of second conductive elements implanted on a side of the substrate where the heat sink is attached, for electrically connecting the substrate to an external device.

2. The semiconductor package as recited in claim 1, wherein the semiconductor package is a Ball Grid Array (BGA) package.

3. The semiconductor package as recited in claim 1, wherein the heat sink is made of a material selected from the group consisting of copper, copper alloy, silver, silver alloy, and other thermally conductive materials.

4. The semiconductor package as recited in claim 1, wherein the heat sink is a metallic thin plate.

5. The semiconductor package as recited in claim 1, wherein black oxidation is performed on the first surface of the heat sink before applying the thermally conductive adhesive thereon, so as to enhance adhesion between the first surface and the thermally conductive adhesive.

6. The semiconductor package as recited in claim 1, wherein brown oxidation is performed on the first surface of the heat sink before applying the thermally conductive adhesive thereon, so as to enhance adhesion between the first surface and the thermally conductive adhesive.

7. The semiconductor package as recited in claim 1, wherein horizontal brown oxidation is performed on the first surface of the heat sink before applying the thermally conductive adhesive thereon, so as to enhance adhesion between the first surface and the thermally conductive adhesive.

8. The semiconductor package as recited in claim 1, wherein a protruding portion is formed on the first surface of the heat sink and protrudes into the opening of the substrate to shorten a heat dissipation path between the semiconductor chip and the heat sink.

9. The semiconductor package as recited in claim 1, wherein a plurality of spaced protruding portions are formed on the first surface of the heat sink and protrude into the opening of the substrate to shorten a heat dissipation path between the semiconductor chip and the heat sink and to increase surface area for heat dissipation.

10. The semiconductor package as recited in claim 1, wherein the thermally conductive adhesive comprises a uniform mixture of at least one type of organic vehicle, solvent, and metallic powder.

11. The semiconductor package as recited in claim 10, wherein the metallic powder is made of a material selected from the group consisting of copper, copper alloy, silver, silver alloy, and other thermally conductive metals.

12. The semiconductor package as recited in claim 1, wherein the first conductive elements are bonding wires.

13. The semiconductor package as recited in claim 12, wherein the bonding wires are connected to the semiconductor chip and the substrate by means of reverse wire-bonding.

14. The semiconductor package as recited in claim 1, wherein the second conductive elements are solder balls.

15. The semiconductor package as recited in claim 1, wherein a thickness of the heat sink is smaller than a height of the second conductive elements soldered to the substrate.

16. The semiconductor package as recited in claim 1, wherein the external device is a printed circuit board.

* * * * *